(12) United States Patent
Carlson

(10) Patent No.: US 6,458,704 B2
(45) Date of Patent: Oct. 1, 2002

(54) LIGHT SENSITIVE CHEMICAL-MECHANICAL POLISHING METHOD

(75) Inventor: David W. Carlson, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/870,349

(22) Filed: May 29, 2001

Related U.S. Application Data

(62) Division of application No. 09/335,229, filed on Jun. 17, 1999, now Pat. No. 6,277,236.

(51) Int. Cl.⁷ ............................................. H01L 21/302
(52) U.S. Cl. ........................ 438/692; 438/693; 438/751; 216/88; 216/89
(58) Field of Search ...................... 216/88, 89; 438/692, 438/693, 751

(56) References Cited

U.S. PATENT DOCUMENTS

| | | | |
|---|---|---|---|
| 5,811,355 A | 9/1998 | Jordan | |
| 5,827,112 A | 10/1998 | Ball | |
| 6,126,523 A | * 10/2000 | Moriyasu et al. | 451/56 |
| 6,277,236 B1 | * 8/2001 | Carlson | 156/345 |

FOREIGN PATENT DOCUMENTS

| | | | |
|---|---|---|---|
| JP | 61-152367 | * | 7/1986 |
| JP | 61-270060 | | 11/1986 |
| JP | 63-134162 | | 6/1988 |
| JP | 06-000774 | * | 1/1994 |
| JP | 09-285962 | * | 11/1997 |
| JP | 10-249735 | | 9/1998 |
| WO | 99/12705 | * | 3/1999 |

* cited by examiner

Primary Examiner—George Goudreau
(74) Attorney, Agent, or Firm—Skjerven Morrill LLP; Christopher B. Allenby

(57) ABSTRACT

A chemical-mechanical polishing apparatus has a surface formed on a solid aggregate comprising a solid suspension of abrasive particles in a light sensitive material. An ultraviolet light source exposes a thin top layer of the surface and a developing fluid develops the exposed surface. The developing fluid dissolves the UV-exposed top portion of the aggregate and a polishing slurry is formed of the developing fluid and the released abrasive particles. The aggregate surface remaining after developing acts as a polishing surface. The polishing slurry is used during chemical-mechanical polishing of a processed semiconductor wafer. After polishing, a rinsing fluid is dispensed to remove used slurry from the polishing aggregate.

15 Claims, 3 Drawing Sheets

LIGHT SENSITIVE CHEMICAL-MECHANICAL POLISHING METHOD

RELATED APPLICATIONS

This application is a divisional application of patent application Ser. No. 09/335,229, entitled "Light Sensitive Chemical-Mechanical Polishing Apparatus and Method," filed Jun. 17, 1999 U.S. Pat. No. 5,277,236, by David W. Carlson, which is incorporated herein by reference.

BACKGROUND

1. Field of Invention

The present invention relates to semiconductor device manufacturing and, in particular, to apparatuses and methods for chemical-mechanical polishing of semiconductor wafers.

2. Related Art

FIG. 1 is a side view of a conventional chemical-mechanical polishing (CMP) apparatus used, for example, to planarize the device surface of a processed semiconductor wafer during device fabrication. Circular platen 10 is shown connected to platen drive 12 through shaft 14. Platen drive 12 causes platen 10 to rotate during polishing operations. Polishing pad 16 is shown mounted on platen 10 top surface 18. The top surface of pad 16 is polishing surface 20. Pad 16 is typically felt or urethane with a foam backing, or a material having an abrasive embedded in surface 20.

Also shown is a conventional wafer carrier 22 positioned over platen 10. Carrier 22 is attached to carrier drive 24 through shaft 26. Carrier 22 holds device surface 28 of processed semiconductor wafer 30 against polishing surface 20 during polishing. During some conventional polishing operations, carrier drive 24 causes carrier 22, and hence wafer 30, to rotate against polishing surface 20. In other conventional polishing operations, carrier drive 24 causes carrier 22, and hence wafer 30, to translate laterally across polishing surface 20. In some apparatuses drive 24 may cause simultaneous rotational and translational motion of carrier 22.

Slurry reservoir 32 supplies conventional polishing slurry 34 to polishing surface 20 using conventional slurry delivery system 36. Slurry 34 may be an abrasive carried in a fluid suspension, a compound formulated to have a chemical effect on device surface 28, or a combination of both. Platen 10's rotation causes slurry 34 to flow radially outward across polishing surface 20, thus creating a thin layer (not shown) of polishing slurry on surface 20. Delivery system 36 typically includes pumps and tubing (not shown).

During conventional chemical-mechanical polishing, slurry 34 is dispensed at a fixed flow rate onto polishing surface 20. Wafer 30 is mounted to carrier 22 which is then positioned to place device surface 28 against polishing surface 20. Platen 10 and carrier 22 are rotated and, as additional slurry 34 is introduced, the desired polishing effect on device surface 28 is obtained. When polishing is completed, carrier 22 is removed from polishing surface 20 and wafer 30 is removed from carrier 22. A new wafer may then be mounted on carrier 22, and the polishing process is repeated.

The polishing operation adversely affects polishing surface 20. The pressure of device surface 28 against polishing surface 20 typically deforms surface 20's fine surface structure. Therefore, a conditioner is typically used either during or after polishing so as to keep surface 20 in a near pristine state. The conditioner is typically a compound of diamonds that are bonded to a substrate. The bonded diamonds and substrate are then nickel plated, and the combination is used to clean and roughen the polishing pad surface. The conditioning process is difficult to optimize, however, and consequently it is difficult to keep polishing surface 20 in the required state for proper polishing. What is required is a chemical-mechanical polishing apparatus and process in which the polishing surface is easily kept in a near optimum state for polishing.

SUMMARY

In accordance with the invention, a chemical-mechanical polishing (CMP) apparatus is configured with an aggregate polishing disk mounted on a rotating platen. The aggregate polishing disk includes abrasive particles held in solid suspension by a radiant energy sensitive bonding agent. In some embodiments the abrasive particles are of silicon oxide (silica), aluminum oxide, or cerium oxide, and the bonding agent is a conventional positive photoresist that is sensitive to ultraviolet (UV) light. The aggregate polishing disk has a flat top surface.

The CMP apparatus also includes a fixture holding a radiant energy source for emitting energy to which the bonding agent is sensitive, such as a UV light source. In some embodiments the UV light source is a plurality of conventional UV producing light bulbs, and in other embodiments a single conventional long UV producing bulb is used. The UV light source fixture is configured with a slot so that UV light from the UV light source shines through the slot. The fixture is positioned over the aggregate polishing disk's top surface so that the slot is approximately aligned with a radius of the disk. Thus, UV light from the UV light source is incident on the aggregate polishing disk top surface through the slot. In some embodiments the slot is a tapered shape so that an approximately equal amount of UV light is incident per unit area of the top surface as the rotating top surface passes beneath the slot. A thin layer of the positive photoresist underneath the top surface is exposed by the incident UV light.

In addition, the CMP apparatus comprises a reservoir containing a developing fluid and a conventional dispensing mechanism to dispense the developing fluid to the aggregate disk's top surface. Some embodiments of the invention use potassium hydroxide (KOH) or ammonium hydroxide ($NH_4OH$) as the developing fluid, although other compounds may be used. In some embodiments of the invention a second reservoir containing a rinsing fluid and a second conventional dispensing mechanism is added. Some embodiments of the invention use deionized water as a rinsing fluid.

In accordance with the invention, a semiconductor wafer may be processed as follows. The aggregate polishing disk is rotated and the top surface receives UV light through the slot in the UV fixture. The UV light exposes a thin top portion of the aggregate disk as the disk rotates. After exposure, developing solution is dispensed onto the aggregate disk's top surface and is dispersed into a thin film by the disk's rotation. The developing fluid develops and dissolves the thin layer of UV-exposed positive photoresist, thus releasing the abrasive particles within the UV-exposed layer. Thus a polishing slurry of developing fluid and abrasive particles is created. The surface underlying the developed thin layer acts as a polishing surface.

A processed semiconductor wafer is mounted to a conventional wafer carrier and is held against the polishing surface of the rotating aggregate disk such that a thin film of polishing slurry exists between the polishing surface and the wafer's device surface. In some embodiments the polishing surface continually receives UV light and developing fluid during polishing. The constant UV exposure and developing of a thin top portion of the polishing disk ensures adequate slurry is available for polishing. In some embodiments the amount of UV exposure and dispensed developing fluid is controlled so as to control the resulting amount of polishing slurry. When polishing is complete the wafer is removed, rinsing fluid is dispensed onto the polishing surface to remove the used polishing slurry, and the polishing process may be repeated for another processed wafer. No polishing surface conditioning is required.

DETAILED DESCRIPTION

The accompanying drawings represent embodiments of the invention and are not drawn to a particular scale. Identical numbers shown in two or more figures represent similar elements.

Figure 1:
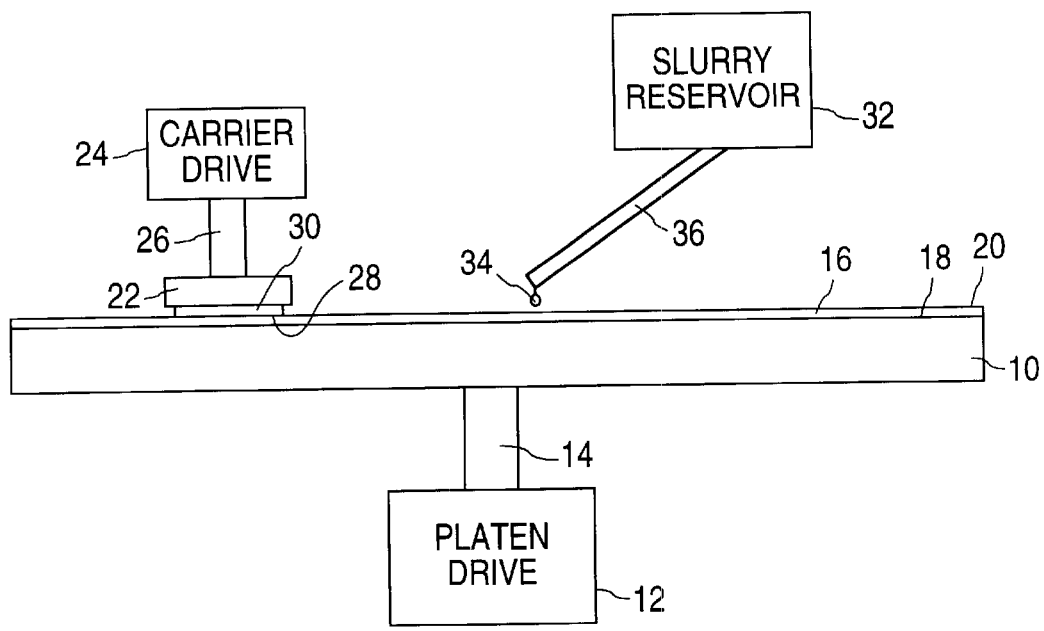
FIG. 1 is a side elevation view of a conventional chemical-mechanical polishing apparatus.
Figure 2:
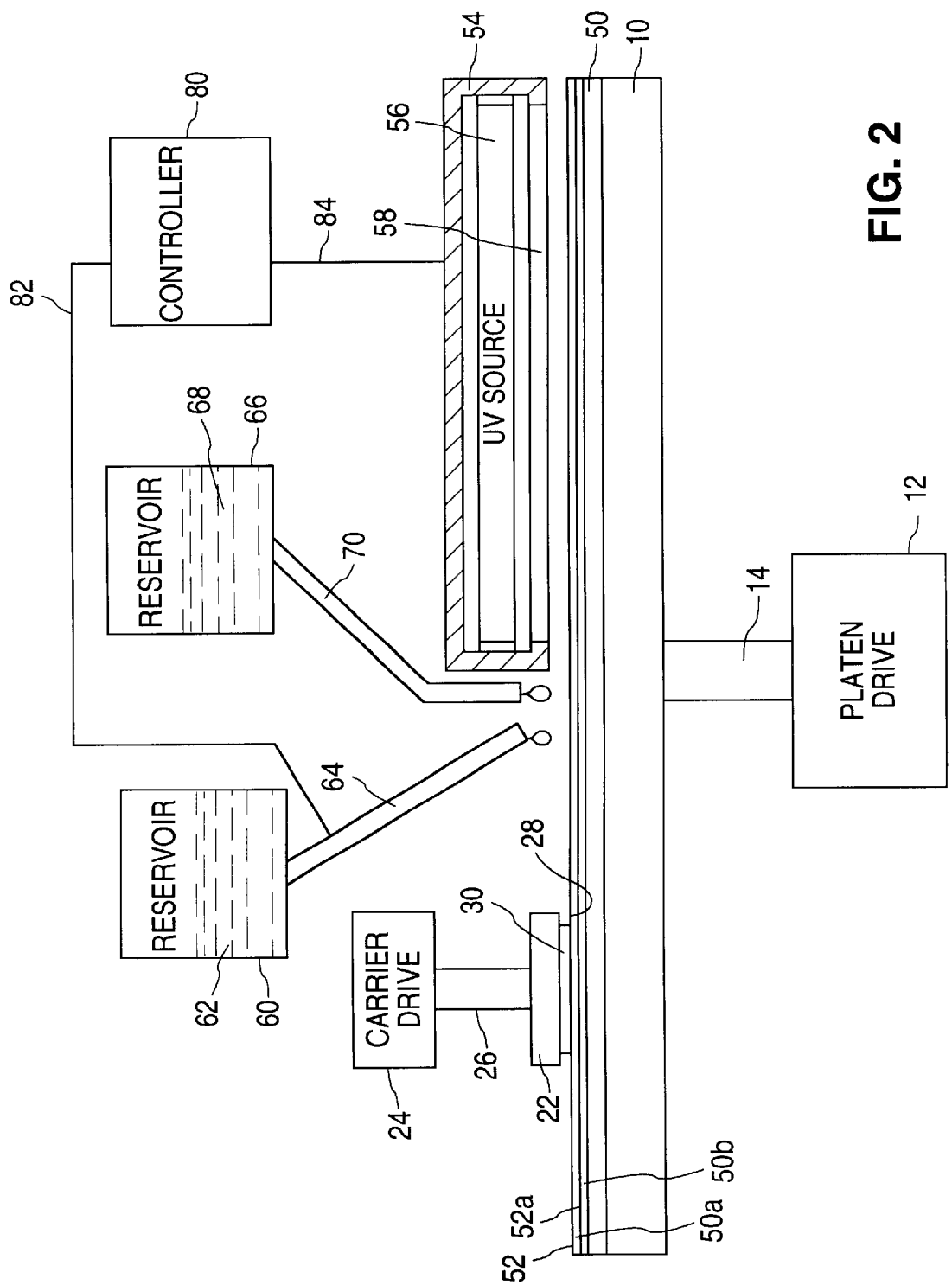
FIG. 2 is a side elevation view of an embodiment of the invention.

FIG. 2 is a side view of an embodiment of the present invention. A conventional chemical-mechanical polishing (CMP) apparatus is shown similar to that shown in FIG. 1. Platen 10 is driven by platen drive 12 through shaft 14. Carrier 22 holds wafer 30 in a polishing position while carrier drive 24 drives carrier 22 through shaft 26.

In accordance with the invention, aggregate polishing disk 50 is mounted on platen 10. In the embodiment shown, polishing disk 50 has a flat top surface 52 and is formed in a circular shape to fit platen 10. Carrier 22 holds wafer 30's device side 28 against a polishing surface of disk 50, as described in detail below.

Aggregate polishing disk 50 includes small abrasive particles held in solid suspension by a radiant energy sensitive bonding agent. Abrasive particles may be silicon oxide, aluminum oxide, cerium oxide, or other material. In one embodiment fumed silica (silicon oxide) particles in the 300–500 angstrom range are used. Abrasive particle concentration within disk 50 is generally 25–75 percent by volume, depending on the particular polishing application, but other concentrations may be used.

Aggregate polishing disk 50 is also formed of a material sensitive to radiant energy. In some embodiments the energy sensitive material is a conventional positive photoresist such as those used for semiconductor fabrication. Disk 50 may be formed, for example, by mixing photoresist with a conventional polishing slurry containing abrasive particles to achieve a desired concentration of abrasive. For example, in some embodiments aggregate polishing disk 50 is formed of conventional fumed silica abrasive particles mixed into a conventional positive photoresist at a desired concentration. The mixture of abrasive particles and photoresist is then molded into a desired shape, such as a disk conforming to the shape of platen 10, and baked (cured) until hard. Some embodiments may be formed using conventional photoresist curing processes with a curing temperature of approximately 95 degrees Celsius. The curing time used is dependent on disk 50's physical characteristics such as thickness and relative make-up of photoresist. Curing time may also be dependent on desired properties once cured, such as hardness. Other embodiments may be formed using different curing temperatures and times.

Polishing disk 50 thickness may vary. As described in detail below, a top portion of disk 50 is slowly developed away during polishing operations. Thus in some embodiments disk 50 is made relatively thick in order to reduce the need for frequent replacement. In other embodiments, however, disk 50 may be thin. In some embodiments, disk 50 may have a backing (not shown) of rigid material, such as FIBERGLAS, attached to provide increased material strength during handling. After curing is complete, a conventional adhesive, such as one presently used to. mount conventional polishing pads on current CMP tools, is used to mount aggregate polishing disk 50, either itself or using the rigid backing, on platen 10. Once disk 50 is cured, inadvertent UV-light exposure may be avoided by using conventional protection methods such as yellow room lighting or yellow filter shielding.

FIG. 2 also shows a cross section of ultraviolet (UV) light fixture 54 containing UV light source 56 and slit 58. In one embodiment UV light source 56 is a conventional UV lamp used in semiconductor fabrication photolithography. In embodiments in which source 56 comprises two or more bulbs, the bulbs should be positioned so that a fairly even UV light intensity is incident on surface 52 through slit 58, as described in detail below. In other embodiments, UV light source 56 may be a conventional long bulb spanning the length of slit 58. Embodiments using a long bulb have the advantage of providing a more even UV light intensity incident on surface 52 through slit 58.

Fixture 54 is typically mounted close to surface 52 so as to control the UV light from source 56 incident on surface 52. The distance between UV light source 58 and polishing surface 52 may vary depending on factors such as the desired UV light intensity incident on surface 52.

Figure 3A:
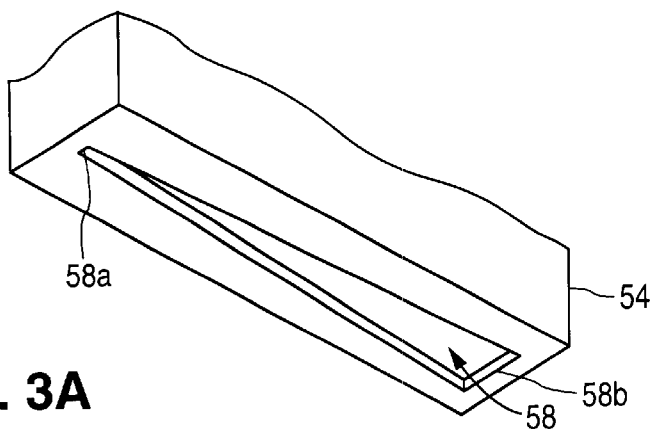
FIGS. 3A and 3B are perspective views of an ultraviolet light fixture used in some embodiments of the invention.
Figure 3B:
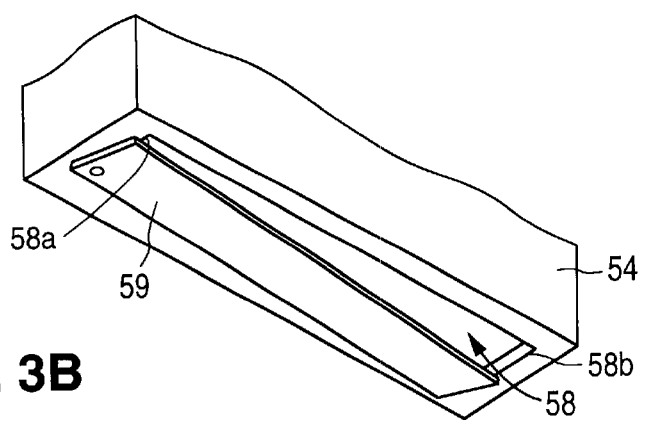

In some embodiments slit 58 has a variable width along its length. FIGS. 3A and 3B show perspective views of fixture 54 and slot 58. As depicted in FIG. 3A, slot 58's width gradually increases from the end 58A, located closest to the center of disk 50, to the opposite end 58b, located closest to the outer edge of disk 50. This increasing taper allows surface 52 to receive an approximately constant light flux per unit area as disk 50 rotates. In some embodiments slit 58 has a constant fixed taper such as that shown in FIG. 3A. In other embodiments, such as one shown in FIG. 3B, an aperture control mechanism 59 allows an operator to vary the width of slot 58 from end 58a to end 58b. Control mechanism 59 embodiments are not limited to the one shown, but may include other aperture control mechanisms such as those used in photographic, image projection, or lighting equipment.

Referring again to FIG. 2, in some embodiments UV light fixture 54 is positioned over aggregate polishing disk 50 so that slot 58 is approximately aligned with a radius of platen 10. In other embodiments fixture 54, or a plurality of similar fixtures, may be placed in other positions above aggregate polishing disk 50.

Embodiments of the invention are not limited to the UV light source as depicted. Some embodiments may use other radiant energy sources such as x-ray, charged particle beam, or laser. In these embodiments the radiant energy sensitive bonding material in disk 50 is chosen to be sensitive to the particular radiant energy source used. The bonding materials dissolvablilty changes upon exposure to the particular radiant energy.

FIG. 2 further shows reservoir 60 containing developing solution 62. In some embodiments, solution 62 is delivered to surface 52 using conventional CMP fluid dispensing apparatus 64 that typically includes a pump and tubing. Rotation of polishing disk 50 mounted on platen 10 causes solution 62 to flow radially outward and form a thin film (not shown) on surface 52. For embodiments in which disk 50 is formed of photoresist, solution 62 is a chemical solution that both develops and dissolves exposed photoresist and is compatible with CMP chemical requirements. Solution 62 embodiments for use with UV sensitive photoresist include potassium hydroxide (KOH) and ammonium hydroxide ($NH_4OH$). KOH and $NH_4OH$ are selected because they are used both during conventional CMP and during photoresist developing. Other chemical compounds having a similar effect may be used depending on disk 50's composition. In addition, solution 62 may contain other reactive chemicals used during conventional CMP device surface planarization.

Also shown is reservoir 66 that contains rinsing fluid 68. As for developing solution 62 discussed above, in some embodiments fluid 68 is delivered to surface 52 using conventional CMP fluid dispensing apparatus 70 that typically includes a pump and tubing. Conventional CMP tools are typically configured to deliver a plurality of fluids to a polishing surface, and so no special fluid dispensing apparatuses are required for many embodiments of this invention. In one embodiment fluid 68 is deionized (DI) water as is used for conventional CMP. Other embodiments of the invention may use another rinsing fluid or fluids.

FIG. 2 shows controller 80 coupled to dispensing apparatus 64 via line 82 and to UV source 56 via line 84 indirectly through fixture 54. Controller 80 may be conventionally configured to control the flow of developer 62 onto disk 50's polishing surfaces during operations. In some embodiments controller 80 may be conventionally configured to control radiated energy output of source 56. In this way, by controlling the amount of disk 50's top surface that is exposed and subject to developing, controller 80 controls the amount and concentration of the polishing slurry (not shown) formed on disk 50's polishing surfaces such as 52a and 52b.

Still referring to FIG. 2, polishing may be accomplished using the following process in accordance with the invention. An aggregate polishing disk 50 is formed of abrasive particles and positive photoresist and mounted on a conventional CMP tool's platen 10, as described above. Platen 10 is rotated and UV source 56 is activated so that UV light shines through slit 58 and is incident on top surface 52. UV light from source 56 exposes a small top portion 50a of disk 50 as disk 50 rotates. Thus UV light incident on the polishing surface 52 of disk 50 should be of a fairly constant flux per unit area of surface 52 in order to ensure that portion 50a has a relatively constant thickness and the resulting polishing surface 52 remains relatively planar. In some embodiments the UV light intensity incident on surface 52 is variable, either by controlling the output light of source 56 or the width of slot 58, to allow an operator to control the thickness of exposed portion 50a.

As disk 50 rotates and is exposed to UV light, developing solution 62 is introduced to surface 52. Solution 62 develops the exposed positive photoresist in portion 50a and thereby releases the abrasive particles held in solid suspension in portion 50a. The top surface 52a of disk 50 that remains undeveloped acts as a polishing surface. Solution 62 acts as a fluid suspension medium for the released abrasive particles, thus forming a thin film of polishing slurry (not shown) on polishing surface 52a. In some embodiments the rate at which solution 62 is dispensed is made variable to allow an operator to control the amount of released abrasive particles. UV light intensities and solution 62 flow rates may be determined by experiment in order to achieve the desired polishing slurry composition and polishing effect on wafer 30.

Once a polishing surface and polishing slurry are formed using the above process, polishing may then proceed in a conventional manner using carrier 22. For example, carrier 22 presses wafer 30 against polishing surface 52a such that the polishing slurry moves across device surface 28. As the polishing process continues, fresh slurry is formed as disk 50 rotates under UV light source 56. UV source 56 exposes a second top portion 50b of disk 50, and additional solution 62 is dispensed to develop and dissolve the photoresist in portion 50b and release abrasive particles. Top surface 52b becomes a polishing surface.

After polishing is complete, wafer 30 is removed from aggregate polishing disk 50 and rinsing fluid 68 is introduced to disk 50's polishing surface. Rinsing fluid 68 washes used polishing slurry and other polishing by-products from the polishing surface. After rinsing, therefore, a fresh surface is exposed and the polishing process may be repeated without the need for conventional polishing surface conditioning.

Figure 4:
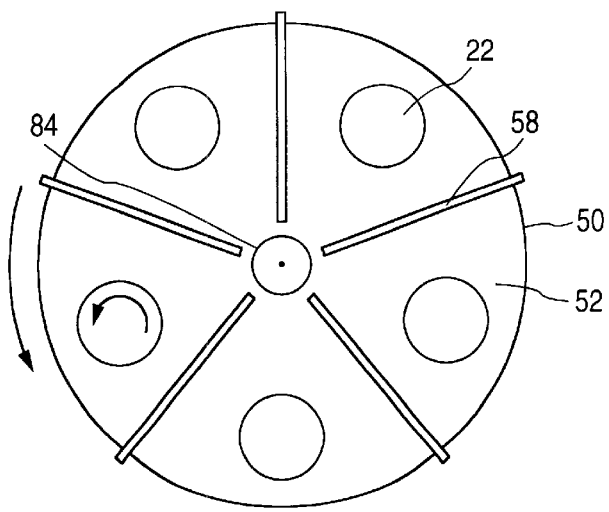
FIG. 4 is a simplified plan view of a second embodiment of the invention.

FIG. 4 is a plan view showing positions for several elements of a second embodiment of the present invention. As shown, aggregate polishing disk 50 is placed on a platen (not shown) of a conventional multi-carrier polishing apparatus such as a Speedfam "Auriga" model. Aggregate polishing disk 50 rotates in a counter-clockwise direction during polishing, as shown by the adjacent arrow. A plurality of carriers 22 are positioned over surface 52 of disk 50, each carrier rotating in a counter-clockwise direction, as the arrow shows. A plurality of UV light fixtures (not shown) are positioned over surface 52 so that slots 58 in each unique fixture are approximately aligned with disk 50 radii. Each unique slit 58 allows UV light shining from a UV light source (not shown) to be incident on a small portion of polishing surface 52. In some embodiments, more or fewer slits 58 may be used. Also shown is a conventional central fluid dispersion fixture 84. In the embodiment shown, developing solution and rinsing fluid as described above may be dispensed onto surface 52 using fixture 84. Fluid reservoirs and fluid dispensing apparatuses such as pumps and tubing have been omitted from the drawing for clarity.

Figure 5:
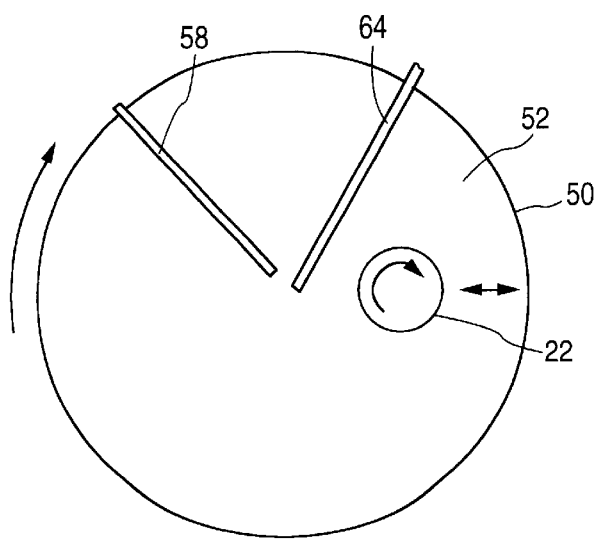
FIG. 5 is a simplified plan view of a third embodiment of the invention.

FIG. 5 is a plan view of a third embodiment of the invention. Shown is a conventional single carrier polishing apparatus such as IPEC/WESTEC models 372, 372M, or 472. As in other embodiments, aggregate polishing disk 50 is shown having surface 52. In this embodiment disk 50 rotates in a clockwise direction, as shown by the arrow. A conventional carrier 22 is positioned over polishing surface 52 and is configured to perform both rotational and translational motion over surface 52 during polishing operation, as shown by the adjacent arrows. In the embodiment shown, a UV light fixture (not shown) is positioned over surface 52 so that slot 58 is approximately aligned with a radius of disk 50. As in other embodiments, UV light from a UV light source (not shown) shines through slot 58 onto surface 52.

Also shown is conventional fluid dispensing apparatus 64 through which developing solution, such as KOH, is introduced onto surface 52. Rinsing fluid may be dispensed onto polishing surface 52 using dispensing apparatus 54, or by using a separate conventional dispensing apparatus (not shown).

Figure 6:
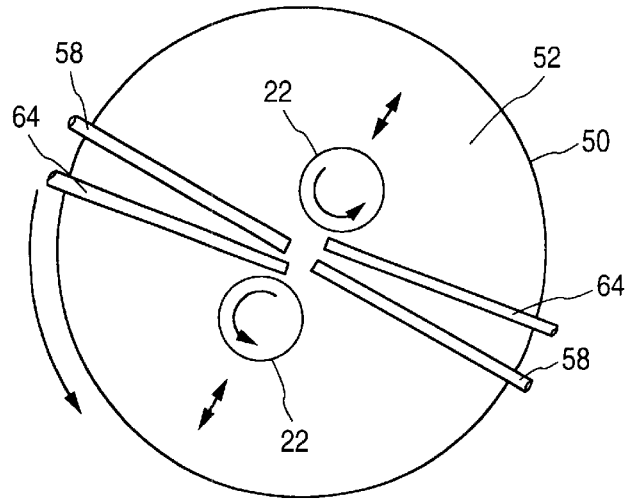
FIG. 6 is a simplified plan view of a fourth embodiment of the invention.

FIG. 6 is a plan view showing positions for several elements of a fourth embodiment of the invention. Shown is a conventional dual carrier polishing apparatus such as a Strasbaugh model 6DSSP. Similar to embodiments described above, aggregate 50 has surface 52 and is configured to rotate as shown by the arrow. Two conventional carriers 22 are also shown positioned above surface 52 and are configured to rotate and translate across surface 52 during polishing, as shown by the adjacent arrows. In the embodiment shown, two UV light fixtures (not shown) are positioned so that slots. 58 are approximately aligned with radii of disk 50. Similar to other embodiments, light from a UV light source (not shown) shines on surface 52 through each unique slot 58. In other embodiments, one or more fixtures having one or more slots 58 may be used. In addition, two fluid dispensing apparatuses 64 are shown configured to dispense fluid such as KOH onto surface 52. As shown, each unique slot 58 and each unique dispensing apparatus 64 is positioned so that a portion of rotating surface 52 is exposed and developed prior to reaching a unique carrier 22. Additional fluid dispensing apparatuses have been omitted from the drawing for clarity.

An added benefit of this invention is that if the aggregate polishing disk is sufficiently hard it will not deform as a carrier presses a wafer against the top polishing surface. In some conventional CMP operations, the device surface closest to the outer edge of a wafer receives greater force as the carrier presses the wafer against the polishing pad's soft top surface. Hence the outermost device surface experiences a material removal rate greater than the device surface closest to the wafer's center. Thus embodiments of this invention may reduce the need for wafer carriers configured to compensate for varying polishing rates when using soft polishing surfaces.

Embodiments of the invention are not limited to those shown in the drawings and described above. Therefore the scope of the invention is limited only by the claims that follow.

I claim:

1. A chemical-mechanical polishing process comprising:
    providing a solid polishing aggregate, said aggregate including abrasive particles and a radiant sensitive material;
    increasing the dissolvability of a selected portion of said radiant energy sensitive material by exposing said selected portion to radiant energy; and,
    forming a polishing slurry on said polishing aggregate by dispensing a fluid onto said selected portion, said fluid dissolving at least some of said selected portion to release a portion of said abrasive particles.

2. The process of claim 1 wherein said radiant energy is in the ultraviolet spectrum and said radiant energy sensitive material is a positive photoresist.

3. The process of claim 1 wherein the material used to form said abrasive particles is selected from the group consisting of silicon oxide, aluminum oxide, and cerium oxide.

4. The process of claim 1 wherein said fluid is selected from the group consisting of potassium hydroxide and ammonium hydroxide.

5. The process of claim 1 further comprising placing a processed semiconductor wafer in contact with said slurry and moving said slurry across a surface of said wafer.

6. The process of claim 1 further comprising dispensing a second fluid onto said aggregate after removing said wafer from said slurry.

7. A chemical-mechanical polishing method comprising the acts of:
    providing a solid semiconductor wafer polishing aggregate comprising a top portion, the top portion comprising abrasive particles suspended in a solid material, wherein the dissolvability of the material changes if the material receives incident photons in a selected energy range;
    increasing the dissolvability of the top portion by exposing the top portion to photons in the selected energy range;
    releasing abrasive particles in the exposed top portion by dispensing a developing fluid onto the exposed top portion; and
    polishing a semiconductor wafer by using the released abrasive particles.

8. The method of claim 7, wherein the material comprises a positive photoresist and wherein the energy range comprises the ultraviolet spectrum.

9. The method of claim 7, wherein the abrasive particles are selected from the group consisting of silicon oxide, aluminum oxide, and cerium oxide.

10. The method of claim 7, wherein the developing fluid is selected from the group consisting of potassium hydroxide and ammonium hydroxide.

11. The method of claim 7, further comprising the act of rinsing a top surface of the aggregate by using a second fluid.

12. The method of claim 7, further comprising the act of controlling the amount of abrasive particles released by controlling a flow rate of the developing fluid.

13. The method of claim 7, further comprising the act of controlling the amount of abrasive particles released by controlling an intensity of the photons.

14. The method of claim 7, wherein the abrasive particles each comprise a diameter of less than about 500 angstroms.

15. The method of claim 7, wherein increasing the dissolvability of the top portion comprises directing onto a part of the top portion an approximately constant flux of photons per unit area of the top portion as the aggregate rotates.

* * * * *